(12) United States Patent
Tan

(10) Patent No.: US 10,056,203 B2
(45) Date of Patent: Aug. 21, 2018

(54) MULTIMETER WITH PROTECTION MECHANISM OF CHARGE SWITCHING

(71) Applicant: BRYMEN TECHNOLOGY CORPORATION, New Taipei (TW)

(72) Inventor: Po-Chao Tan, New Taipei (TW)

(73) Assignee: BRYMEN TECHNOLOGY CORPORATION, New Taipei (TW)

( * ) Notice: Subject to any disclaimer, the term of this patent is extended or adjusted under 35 U.S.C. 154(b) by 43 days.

(21) Appl. No.: 15/294,658

(22) Filed: Oct. 14, 2016

(65) Prior Publication Data
US 2018/0108502 A1 Apr. 19, 2018

(51) Int. Cl.
*H01H 13/70* (2006.01)
*H05K 5/00* (2006.01)
*H02J 7/00* (2006.01)
*G01R 15/12* (2006.01)

(52) U.S. Cl.
CPC .............. *H01H 13/70* (2013.01); *G01R 15/12* (2013.01); *H02J 7/0052* (2013.01); *H05K 5/0026* (2013.01)

(58) Field of Classification Search
CPC ...... H01H 13/70; H01H 19/11; H01H 19/585; H05K 5/0026; H02J 7/0052; H02J 7/0044; G01R 15/12; G01R 15/125; G01R 15/002; G01R 1/04; G01R 1/22; G01R 1/38; G01R 1/06788; G01R 1/36; G01R 13/02; G01R 15/186; G01R 15/00; G01R 15/08; G01R 15/14; G01R 15/148; G01R 15/202; G01R 15/207; G01R 19/0084; G01R 19/25;

(Continued)

(56) References Cited

U.S. PATENT DOCUMENTS 5,166,599 A * 11/1992 Hochreuther .......... G01R 15/12
324/110
5,243,275 A * 9/1993 Nakazawa ............. G01R 15/08
324/110

(Continued)

FOREIGN PATENT DOCUMENTS

CN 205091380 * 3/2016

OTHER PUBLICATIONS

English Machine Translation Wang CN 205091380.*

*Primary Examiner* — Tung X Nguyen
*Assistant Examiner* — Lee Rodak
(74) *Attorney, Agent, or Firm* — Chun-Ming Shih; HDLS IPR SERVICES

(57) ABSTRACT

A multimeter has a protection mechanism of charging. A measuring body includes a shell and a knob-turning set, and the shell has a charging socket. A control module is disposed in the shell and includes a circuit board and a connector electrically connected with the circuit board. The connector is disposed corresponding to the charging socket, and the circuit board is electrically connected with the knob-turning set and selectively actuated through a rotation of the knob-turning set. A charging unit is disposed in the shell and electrically connected with the connector. A stopper moves with the knob-turning set together. An external plug is inserted with the connector via the charging socket, and the stopper is actuated so that the knob-turning set will not to be rotated. Thus, it ensures the multimeter cannot perform a measurement when it is charging for avoiding danger.

1 Claim, 7 Drawing Sheets

(58) Field of Classification Search
CPC .. G01R 19/2503; G01R 29/18; G01R 31/026; G01R 31/3278; G01D 11/24; G01J 5/04
See application file for complete search history.

(56) References Cited

U.S. PATENT DOCUMENTS

| | | | | |
|---|---|---|---|---|
| 5,442,337 | A * | 8/1995 | Hwang | G01R 15/125 324/110 |
| 5,619,129 | A * | 4/1997 | Kamiya | G01R 1/36 324/110 |
| 2014/0002059 | A1 * | 1/2014 | Heishi | G01R 1/38 324/115 |
| 2016/0161560 | A1 * | 6/2016 | Barden | G01R 1/06788 324/418 |

* cited by examiner

US 10,056,203 B2

MULTIMETER WITH PROTECTION MECHANISM OF CHARGE SWITCHING

BACKGROUND OF THE INVENTION

Field of the Invention

The present invention generally relates to a multimeter and, more particularly, to a multimeter with a charging function.

Description of Prior Art

A multimeter is mainly applied for measurement in the field of physics, electricity and electronics. Generally speaking, a multimeter usually provides multi features such as ammeter, voltmeter, resistance meter (ohmmeter), and other special functions are also included in the multimeter to be applied various applications for needs. Thus a multimeter is also called a universal meter.

Existing electronic measuring instruments commonly use dry cells as power. Nevertheless, dry cells have to be replaced for continuous measuring, and it causes great inconvenient to replace dry cells often. Moreover, if dry cells are replaced by rechargeable batteries and uses standard USB connectors, then their external chargers must be designed to comply with the LVD (Low Voltage Directive) specification formulated by the EU IEC (International Electrotechnical Commission) such as IEC-61010-1, etc., in which the specifications of contact protection for human are much different from those of consumer 3C products. It will cause an electric shock hazard if users perform a high voltage measuring while using a general external charger. Therefore, we must pay attention and care about it.

In view of the above drawbacks, the Inventor proposes the present invention based on his expert knowledge and elaborate researches in order to solve the problems of prior art.

SUMMARY OF THE INVENTION

Accordingly, an object of the present invention is to provide a multimeter with protection mechanism of charge switching, in which a stopper is provided as the protection mechanism that can ensure the multimeter not performing a measurement when it is charging with a general standard USB charger to avoid danger.

In order to achieve the object mentioned above, the present invention provides a multimeter with protection mechanism of charge switching. A measuring body comprises a shell and a knob-turning set, and the shell has a charging socket. A control module is disposed in the shell and includes a circuit board and a connector. The connector is disposed corresponding to the charging socket, and the circuit board is electrically connected with the knob-turning set and selectively actuated through a rotating of the knob-turning set. A charging unit is disposed in the shell and electrically connected with the connector. A stopper moves with the knob-turning set together, wherein an external plug is inserted with the connector via the charging socket, and then the stopper will be actuated so that the knob-turning set will not to be rotated.

In order to achieve the object mentioned above, the present invention provides a multimeter with protection mechanism of charge switching. A measuring body comprises a shell and a knob-turning set combining with the shell, and the shell has a charging socket. A control module is disposed in the shell and includes a circuit board, a connector electrically connected with the circuit board and a plurality of conductive terminals. The connector is disposed corresponding to the charging socket, and the circuit board is electrically connected with the knob-turning set and selectively actuated through a rotation of the knob-turning set. A charging unit is disposed in the shell and electrically connected with the connector. A carrying member is disposed on the circuit board and carried by the knob-turning set. A shielding plate is carried by the carrying member and is capable of selectively shielding the conductive terminals; wherein an external plug is inserted with the connector through the charging socket, and the shielding plate is carried by the carrying member to shield the conductive terminals.

Comparing to the prior art, the multimeter with protection mechanism of charge switching includes a knob-turning set and a stopper, and the stopper moves with the knob-turning set together. In addition, the shell has a charging socket. When the multimeter is charging, the knob-turning set will rotate to an indication location corresponding to the charging function, at this moment, the stopper will rotate to a position above the connector with the rotation of knob-turning set. Thus, the external plus will insert in the stopper to prevent the knob-turning set from rotating. Thereby, when the multimeter is charging, the knob-turning set cannot rotate to the indication location corresponding to the charging function to perform a measurement. Therefore, the stopper can be provided as a protection mechanism of charging for the charging unit to increase the safety and utility of the present invention.

BRIEF DESCRIPTION OF DRAWING

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

In cooperation with attached drawings, the technical contents and detailed description of the invention are described thereinafter according to a number of preferable embodiments, being not used to limit its executing scope. Any equivalent variation and modification made according to appended claims is all covered by the claims claimed by the present invention.

Figure 1:
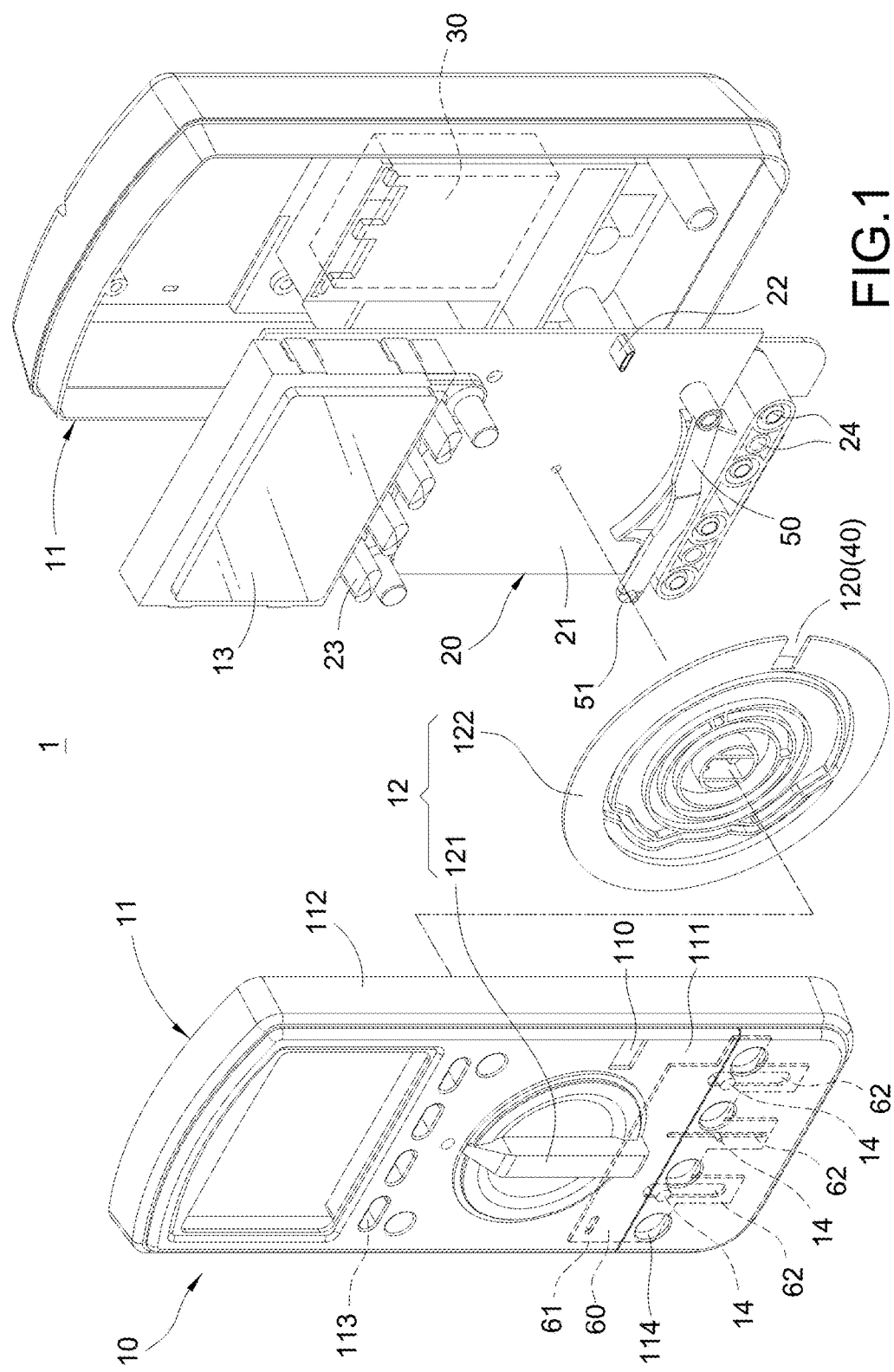
FIG. 1 is a perspective explosion schematic view of the multimeter with protection mechanism of charge switching of the present invention.
Figure 2:
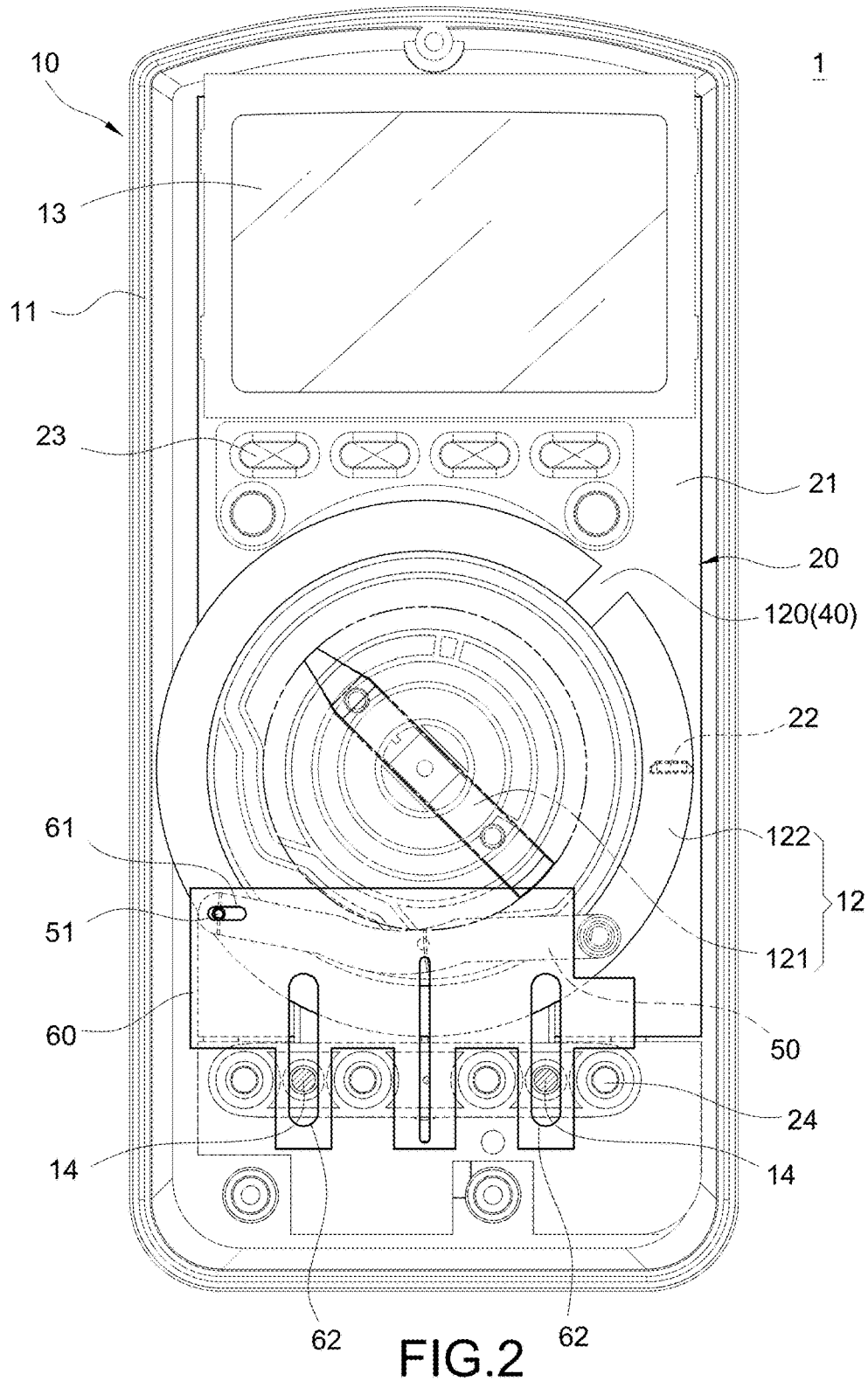
FIG. 2 is a plan schematic view of assembly of the multimeter with protection mechanism of charge switching of the present invention.

Please refer to FIG. 1 and FIG. 2, and they depict a perspective explosion schematic view and a plan schematic view of assembly of a multimeter with protection mechanism of charge switching of the present invention. A multimeter 1 with protection mechanism of charge switching of the present invention includes a measuring body 10, a control module 20, a charging unit 30 and a stopper 40. The control module 20, the charging unit 30 and the stopper 40 are disposed in the measuring body 10. The charging unit 30 performs a charging through the control module 20, and the stopper 40 provides a stop function when the charging unit 30 is charging for preventing the multimeter 1 from measuring. Thereby, the stopper 40 is provided as a protection mechanism of charge switching of the charging unit 30.

The measuring body 10 comprises a shell 11 and a knob-turning set 12 combining with the shell 11, and the shell 11 has a charging socket 110; preferably, the knob-turning set 12 includes a knob 121 exposed from the shell 11 and a rotating plate 122 carried by the knob 121.

The control module 20 is disposed in the shell 10 and includes a circuit board 21 and a connector 22 electrically connected with the circuit board 21. Besides, the connector 22 is disposed corresponding to the charging socket 110; the circuit board 21 is electrically connected with the knob-turning set 12 and selectively actuated through a rotation of the knob-turning set 12 for measuring.

In the present embodiment, the control module 20 further includes a plurality of control keypads 23 and a plurality of conductive terminals 24; the control keypads 23 and the conductive terminals 24 are electrically connected with the circuit board 21. In addition, the shell 11 has a plurality of control holes 113 corresponding to the control keypads 23 and has a plurality of conductive holes 114 corresponding to the conductive terminals 24. Therefore, the control keypads 23 and the conductive terminals 24 are exposed from the shell 11 from the control holes 113 and the conductive holes 114 respectively.

Moreover, the measuring body 10 further comprises a display unit 13; the display unit 13 is disposed in the shell 11 and electrically connected with the circuit board 21.

In the present embodiment, the shell 11 includes an operating side 111 exposed from the display unit 13 and an outer side 112 neighboring the operating side 111. Preferably, the charging socket 110 is located at the operating side 111, and an inserting direction of the connector 22 is toward the operating side 111; that is, when the multimeter 1 is charging, an external plug is inserted at the operating side 111 of the shell 11.

Furthermore, the charging unit 30 is disposed in the shell 30 and electrically connected with the connector 22. Additionally, the stopper 40 moves with the knob-turning set 12 together. When an external plug (not shown) is inserted with the connector 22 via the charging socket 110, the stopper 40 will be actuated so that the knob-turning set 12 cannot be rotated.

It is worth of notice that the configuration of the stopper 40 is not limited to such as a notch in the present embodiment. In real practice, the configuration of the stopper 40 is designed to be able to stop the rotation of the knob-turning set 12.

Furthermore, the multimeter 1 with protection mechanism of charge switching of the present invention further includes a carrying member 50 and a shielding plate 60. The carrying member 50 is disposed on the circuit board 21 and carried by the rotating plate 122, and the shielding plate 60 is carried by the carrying member 50. More specifically, one end of the carrying member 50 has a post 51, and the shielding plate 60 has provided with a through hole 61 correspondingly. The carrying member 50 is capable of carrying the shielding plate 60 by the post 51 inserting in the through hole 61.

Preferably, the shielding plate 60 has a plurality of guiding grooves 62, and the shell 11 has provided with a plurality of guiding columns 14 corresponding to the guiding grooves 62. The shielding plate 60 is capable of moving along a direction which the guiding grooves 62 extending by the guiding columns 14 inserting in the guiding grooves 62.

It is worth of notice that the configuration of the shielding plate 60 is corresponded with the locations of the conductive holes 114. Therefore, when the shielding plate 60 moves, the shielding plate 60 can selectively shield the conductive holes 114. In the present embodiment, when the shielding plate 60 is carried by the carrying member 50, the shielding plate 60 will move along the guiding grooves 62 (shown as longitudinally extending) and in a longitudinal movement inside the shell 12. Then the shielding plate 60 will selectively shield the conductive holes 114.

As shown in FIG. 2, when the multimeter 1 with protection mechanism of charge switching of the present invention performs a measuring, the knob-turning set 12 will rotate to an indication location corresponding to the measurement function. At the same time, the notch 120 (stopper 40) will rotate to a position beside the connector 22 with the knob-turning set 12. That is, when the multimeter performs a measuring, the connector 22 of the multimeter 1 will not be exposed so that the multimeter 1 cannot be charged when performs a measuring.

Also notice that when the multimeter 1 performs a measuring, the carrying member 50 will carry the shielding plate 60 moving upward with the rotation of the knob-turning set 12. In the meantime, the shielding plate 60 will not shield the conductive holes 114 so that the conductive holes 114 will be exposed. Therefore, external measuring terminals (not shown) can insert in the conductive terminals 24 to perform a measuring.

Figure 3:
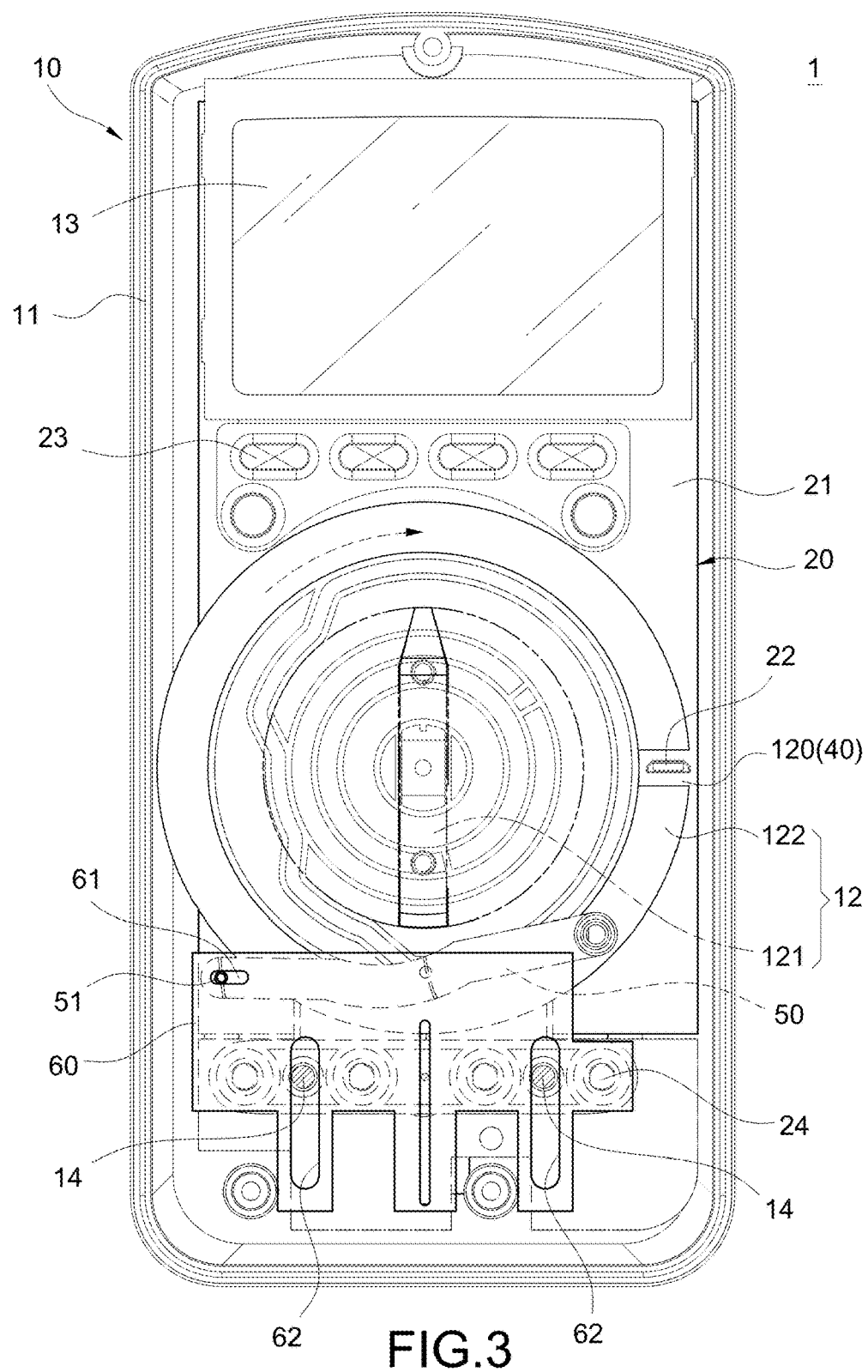
FIG. 3 is a rotating schematic view of the multimeter of the present invention for charging.
Figure 4:
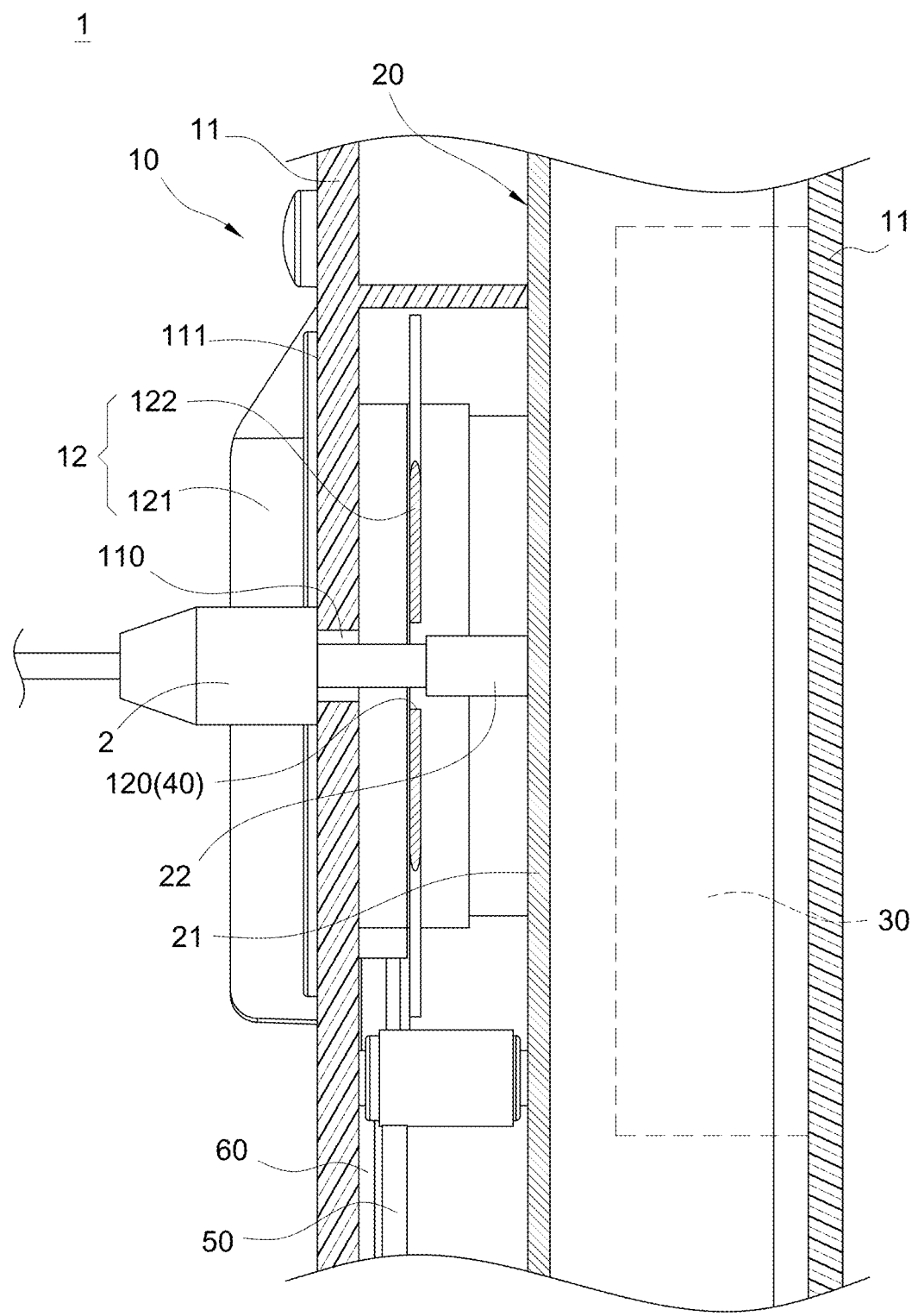
FIG. 4 is a cross sectional view of the multimeter of the present invention while charging.

With further referring to FIG. 3 and FIG. 4, they depict a rotating schematic view of the multimeter of the present invention for charging and a cross sectional view of the multimeter of the present invention when charging. As shown in FIG. 3, when the multimeter 1 of the present invention wants to perform a measuring, the knob-turning set 12 has to rotate to a position corresponding to the charging indication location. Then the notch 120 (stopper 40) will rotate to a position above the connector 22 with the knob-turning set 12. That is, when the multimeter 1 performs a measuring, the connector 22 of the multimeter 1 will be exposed from the notch 120 for an external plug to insert with the connector 22 via the notch 120 from the charging socket 110.

It is worth of notice that when the multimeter 1 performs a charging, the carrying member 50 will carry the shielding plate 60 moving downward with the knob-turning set 12. Hence the shielding plate 60 will shield the conductive holes 114, and the conductive holes 114 will also be shielded without being exposed. Therefore, external measuring terminals cannot insert in the conductive terminals 24, and a measuring cannot be performed.

As shown in FIG. 4, when an external plug 2 is inserted with the connector 22 via the notch 120 from the charging socket 110 of the shell 11, the external plug 2 will insert in the notch 120 (stopper 40) so that the knob-turning set 12 will not be rotated. Therefore, when the multimeter 1 is charging, the knob-turning set 12 of the multimeter 1 cannot be rotated to the indication position of the measurement function, and the circuit board 21 cannot work through the rotation of the knob-turning set 12.

Figure 5:
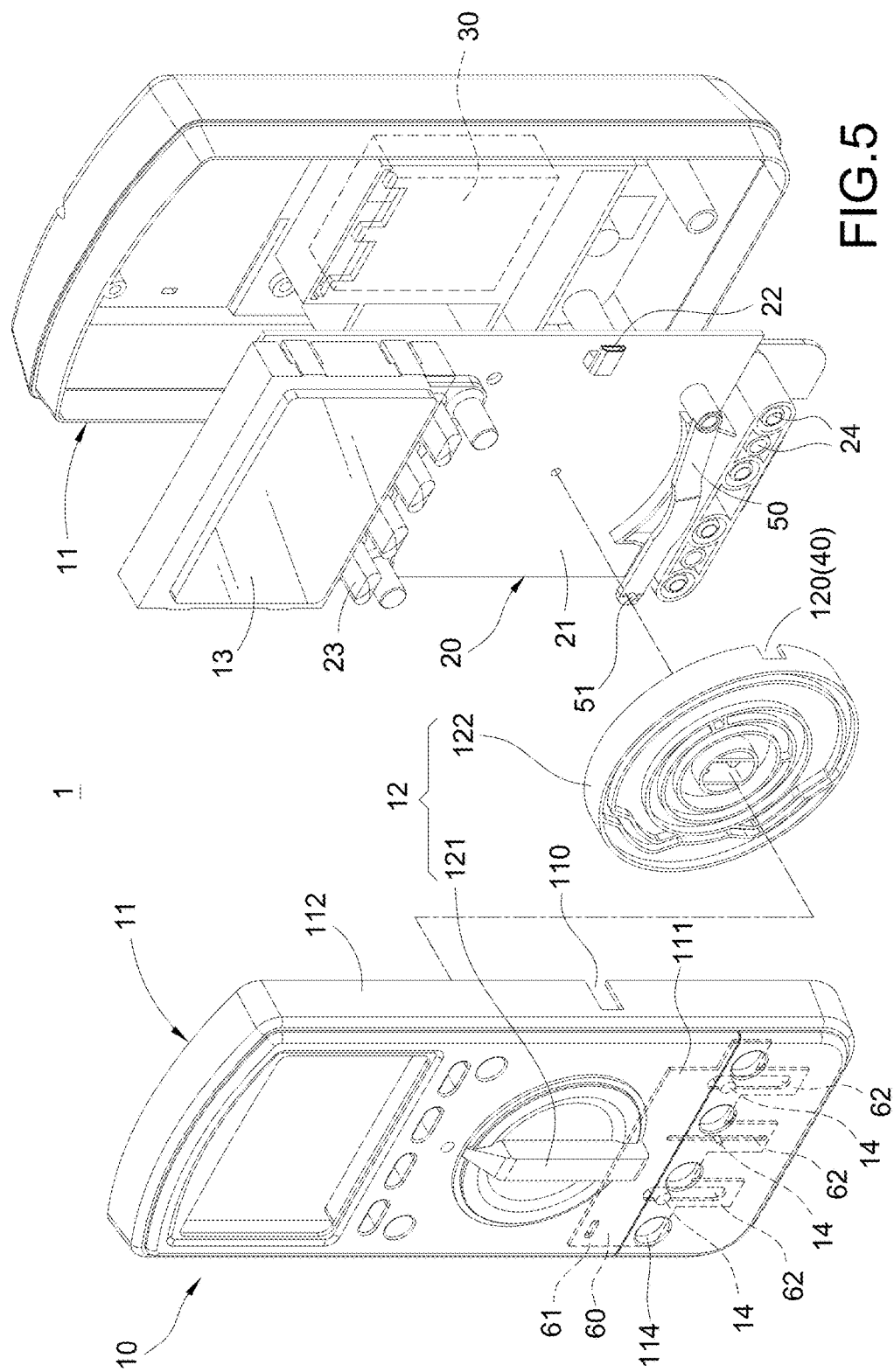
FIG. 5 is another embodiment of the charging socket of the multimeter of the present invention.

Please also refer to FIG. 5, and it depicts another embodiment of a charging socket of the multimeter of the present invention. The present embodiment is substantially the same with the previous embodiment. A multimeter 1 with protection mechanism of charge switching of the present invention includes a measuring body 10, a control module 20, a charging unit 30 and a stopper 40. Moreover, the measuring body 10 comprises a shell 11 and a knob-turning set 12, and the shell 11 has a charging socket 110. Besides, the control module 20 includes a circuit board 21 and a connector 22. A difference between the present embodiment and the previous embodiment is an insertion direction of the connector 22.

In the present embodiment, the shell 11 includes an operating side 111 and an outer side 112 neighboring the operating side 111. Moreover, the charging socket 110 is located at the outer side 112, and an inserting direction of the connector 22 is toward the outer side 112; that is, when the multimeter 1 is charging, an external plug is inserted at the outer side 112 of the shell 11.

Figure 6:
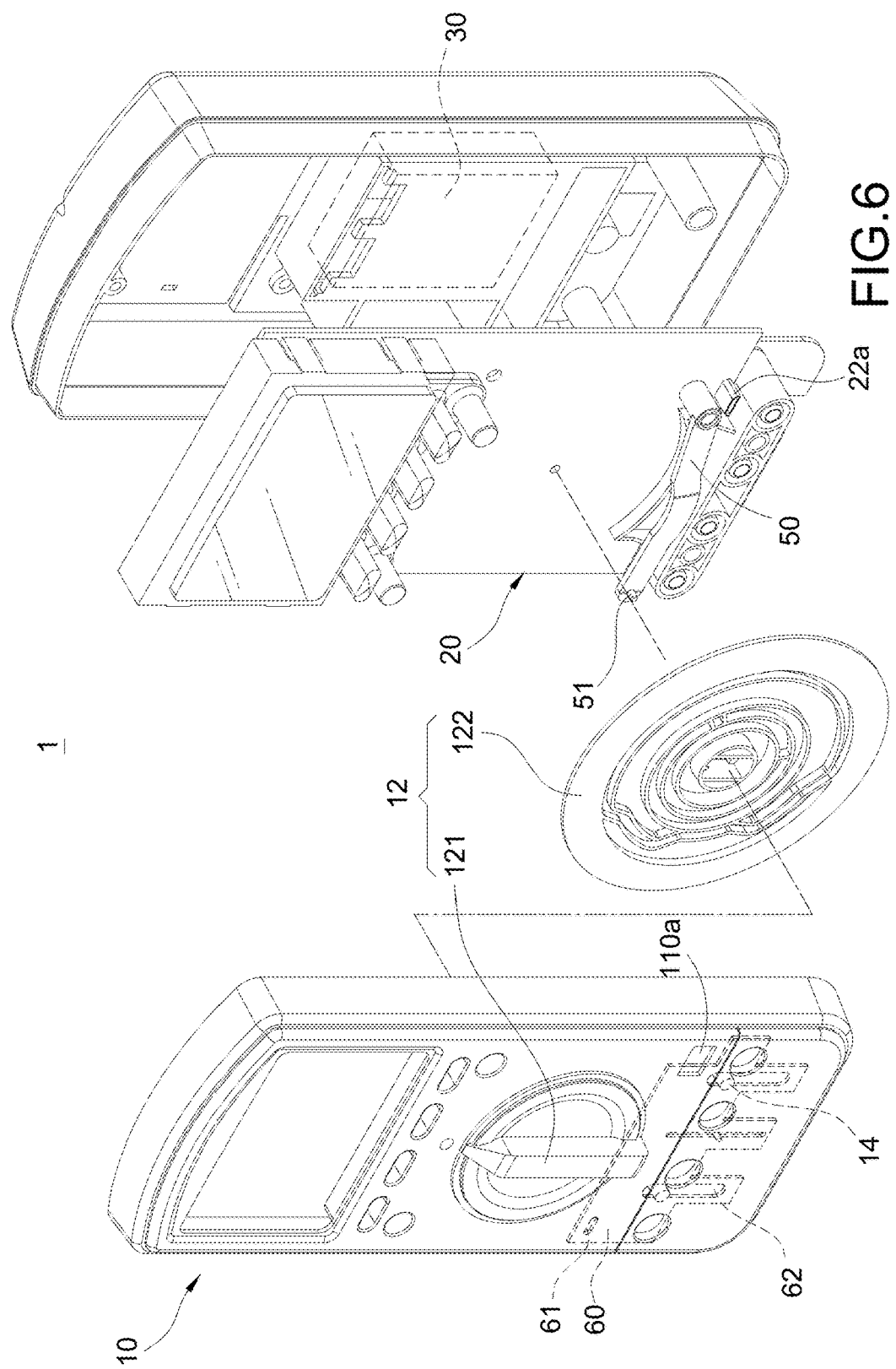
FIG. 6 is a perspective explosion schematic view of another embodiment of the multimeter with protection mechanism of charge switching of the present invention.
Figure 7:
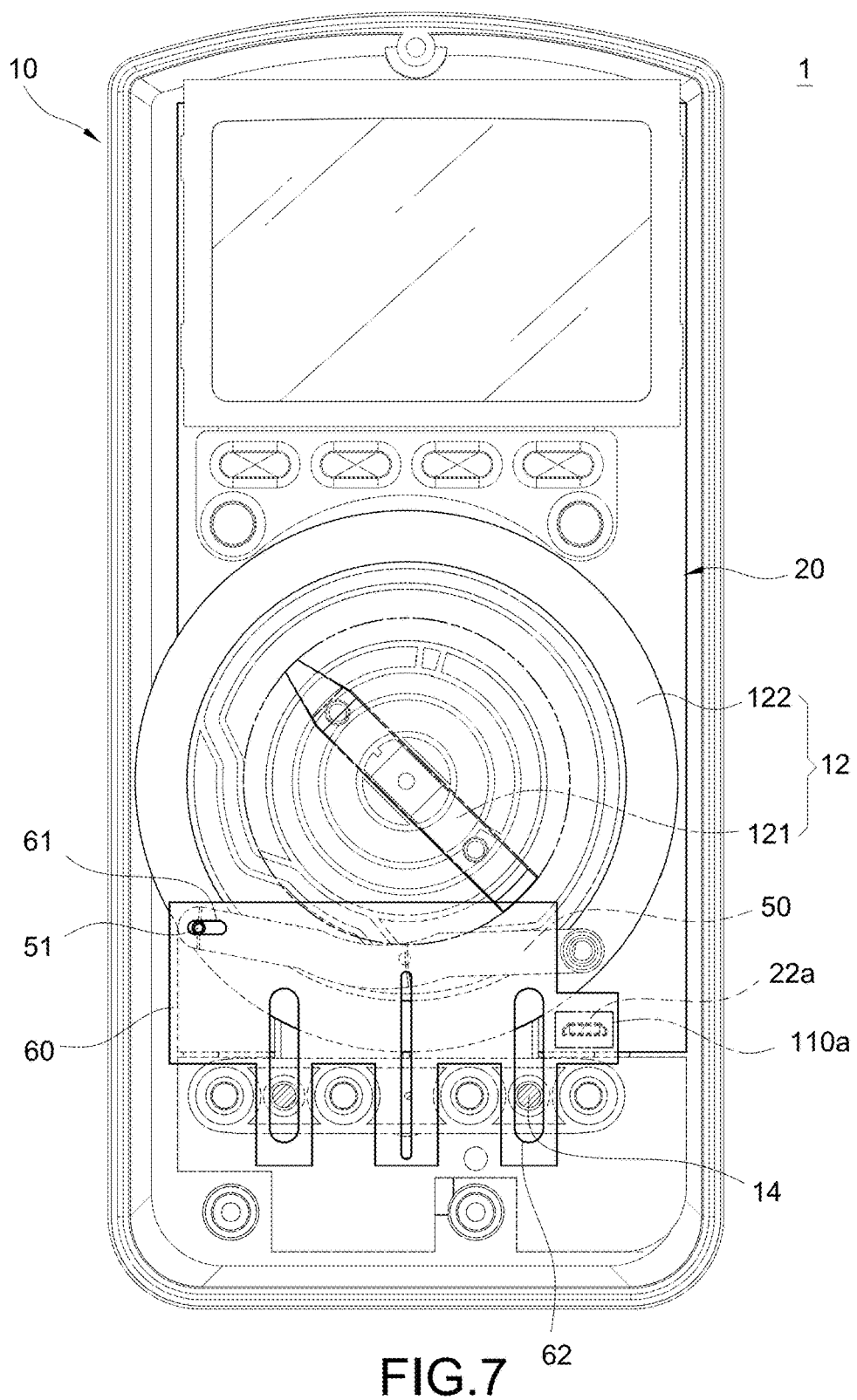
FIG. 7 is a plan schematic view of another embodiment of the multimeter with protection mechanism of charge switching of the present invention for charging.

Please also refer to FIG. 6 and FIG. 7, and they depict another perspective explosion schematic view of a multimeter with protection mechanism of charge switching of the present invention and a plan schematic view when charging. The present embodiment is substantially the same with the previous embodiment, and a difference therebetween is an embodiment of the protection mechanism of charge switching. In the present embodiment, a multimeter 1 with protection mechanism of charge switching of the present invention includes a measuring body 10, a control module 20, a charging unit 30, a carrying member 50 and a shielding plate 60. A more detail of the embodiment of the protection mechanism of charge switching is described as following.

As shown in FIG. 6, the measuring body 10 comprises a shell 11 and a knob-turning set 12 combining with the shell 11, and the shell 11 has a charging socket 110a. Preferably, the knob-turning set 12 includes a knob 121 and a rotating plate 122. The control module 20 is disposed in the shell 11 and includes a circuit board 21, a connector 22a electrically connected with the circuit board 21 and a plurality of conductive terminals 24. Besides, the connector 22 is disposed corresponding to the charging socket 110; the circuit board 21 is electrically connected with the knob-turning set 12 and selectively actuated through a rotation of the knob-turning set 12 for measuring. Furthermore, the charging unit 30 is disposed in the shell 30 and electrically connected with the connector 22a.

Additionally, the carrying member 50 is disposed on the circuit board 21 and carried by the rotating plate 122; besides, the shielding plate 60 is carried by the carrying member 50 and is capable of shielding the conductive terminals 24. In the present embodiment, an external plug is inserted with the connector 22a from the charging socket 110a. In the meantime, the shielding plate 60 will be carried by the carrying member 50 to shield the conductive terminals 24. It is worth of notice that the acts of the shielding plate 60 and the carrying member 50 are described as above and will not describe again herein.

As shown in FIG. 7, when the multimeter 1 is charging, the carrying member 50 will carry the shielding plate 60 moving downward with the rotation of the knob-turning set 12. In the meantime, the shielding plate 60 will shield the conductive terminals 24 without being exposed. Therefore, external measuring terminals cannot insert in the conductive terminals 24 and a measuring cannot be performed. Thereby a protection mechanism will be achieved while charging.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. A multimeter with a protection mechanism, including:
a measuring body comprising a shell and a knob-turning set combining with the shell, and the shell having a charging socket;
a control module disposed in the shell and including a circuit board, a connector electrically connected with the circuit board and a plurality of conductive terminals; the connector being disposed corresponding to the charging socket, and the circuit board being electrically connected with the knob-turning set and being selectively actuated through a rotation of the knob-turning set;
a charging unit disposed in the shell and electrically connected with the connector;
a carrying member disposed on the circuit board and carried by the knob-turning set; and
a shielding plate carried by the carrying member and being capable of selectively shielding the conductive terminals;
wherein the connector is disposed in a position adjacent to the charging socket such that when an external plug is inserted into the connector through the charging socket, the shielding plate is carried by the carrying member to shield the conductive terminals;
wherein one end of the carrying member has a post, and the shielding plate has a corresponding through hole; the carrying member is inserted in the through hole via the post and is capable of carrying the shielding plate;
wherein the shielding plate has a plurality of guiding grooves, and the shell has a plurality of guiding columns corresponding to the guiding grooves; the guiding columns are inserted into the guiding grooves enabling the shielding plate to move along a direction in which the guiding grooves extend.

\* \* \* \* \*